United States Patent
Vaid et al.

(10) Patent No.: US 9,330,985 B2
(45) Date of Patent: May 3, 2016

(54) AUTOMATED HYBRID METROLOGY FOR SEMICONDUCTOR DEVICE FABRICATION

(75) Inventors: Alok Vaid, Ballston Lake, NY (US); Ned R. Saleh, Santa Clara, CA (US); Matthew J. Sendelbach, Fishkill, NY (US); Narender N. Rana, Highland, NY (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 648 days.

(21) Appl. No.: 13/419,286

(22) Filed: Mar. 13, 2012

(65) Prior Publication Data

US 2013/0245806 A1 Sep. 19, 2013

(51) Int. Cl.
G06F 19/00 (2011.01)
H01L 21/66 (2006.01)
G03F 7/20 (2006.01)

(52) U.S. Cl.
CPC ............ H01L 22/12 (2013.01); G03F 7/70625 (2013.01); H01L 22/20 (2013.01)

(58) Field of Classification Search
CPC ...... H01L 22/20; H01L 22/12; G03F 7/70625
USPC ...................... 700/108; 702/81, 83
See application file for complete search history.

(56) References Cited

U.S. PATENT DOCUMENTS

| 6,608,689 | B1 | 8/2003 | Wei et al. | |
|---|---|---|---|---|
| 7,286,247 | B2 | 10/2007 | Archie et al. | |
| 8,682,466 | B2 * | 3/2014 | Ko et al. | 700/110 |
| 8,723,116 | B2 * | 5/2014 | Foucher et al. | 250/307 |
| 2003/0071994 | A1 | 4/2003 | Borden et al. | |
| 2005/0132306 | A1 | 6/2005 | Smith et al. | |
| 2008/0275586 | A1 * | 11/2008 | Ko et al. | 700/110 |
| 2013/0203188 | A1 * | 8/2013 | Vaid et al. | 438/14 |
| 2013/0245806 | A1 * | 9/2013 | Vaid et al. | 700/108 |
| 2014/0191374 | A1 * | 7/2014 | Strocchia-Rivera | 257/622 |
| 2014/0241610 | A1 * | 8/2014 | Duffy et al. | 382/149 |
| 2014/0273299 | A1 * | 9/2014 | Vaid et al. | 438/14 |

OTHER PUBLICATIONS

Sendelbach et al., "Scatterometry measurement precision and accuracy below 70 nm," Metrology, Inspection, and Process Control for Microlithography XVII, Proceedings of SPIE vol. 5038 (2003), downloaded from: http://proceedings.spiedigitallibrary.org/ on Sep. 7, 2014.

USPTO, Office Action for U.S. Appl. No. 13/365,920, mailed Sep. 12, 2014.

USPTO, Final Office Action for U.S. Appl. No. 13/365,920 mailed Apr. 10, 2015.

(Continued)

Primary Examiner — Michael D Masinick
(74) Attorney, Agent, or Firm — Ingrassia Fisher & Lorenz, P.C.

(57) ABSTRACT

Methods and systems are provided for fabricating and measuring features of a semiconductor device structure. An exemplary method of fabricating a semiconductor device structure involves fabricating a feature of the semiconductor device structure on a wafer of semiconductor material, determining a hybrid recipe for measuring the feature, configuring a plurality of metrology tools to implement the hybrid recipe, and obtaining a hybrid measurement of the feature in accordance with the hybrid recipe.

19 Claims, 3 Drawing Sheets

(56) References Cited

OTHER PUBLICATIONS

Silver, R. et al., "Improving optical measurement accuracy using multi-technique nested uncertainties" in Metrology, Inspection, and Process Control for Microlithography XXIII, edited by John A. Allgair, Christopher J. Raymond, Proceedings of SPIE vol. 7272 (SPIE, Bellingham, WA 2009) 727202.

Rana, N. et al., "Hybrid reference metrology exploiting patterning simulation" in Metrology, Inspection, and Process Control for Microlithography XXIV, edited by Christopher J. Raymond, Proceedings of SPIE vol. 7638 (SPIE, Bellingham, WA 2010) 76380W.

Foucher, J. et al., "3D-AFM enhancement for CD metrology dedicated to lithography sub-28-nm node requirements" in Metrology, Inspection, and Process Control for Microlithography XXIV, edited by Christopher J. Raymond, Proceedings of SPIE vol. 7638 (SPIE, Bellingham, WA 2010) 763802.

Vaid A. et al., "Simultaneous measurement of optical properties and geometry of resist using multiple scatterometry targets" in Journal of Micro/Nanolithography, MEMS, and MOEMS 9(04) 041306 (Dec. 9, 2010).

U.S. Appl. No. 13/365,920, filed Feb. 3, 2012.

Vaid et al., "A Holistic Metrology Approach: Hybrid Metrology Utilizing Scatterometry," Proceedings of SPIE vol. 7971 (Mar. 28, 2011) 797103.

Vaid et al., "Hybrid Metrology for Advanced Semiconductor Fabrication," SPIE Newsroom, (Aug. 17, 2011).

* cited by examiner

AUTOMATED HYBRID METROLOGY FOR SEMICONDUCTOR DEVICE FABRICATION

TECHNICAL FIELD

Embodiments of the subject matter described herein generally relate to semiconductor device structures and related fabrication methods and metrologies, and more particularly, embodiments of the subject matter relate to determining hybrid measurements of physical features, dimensions, or other attributes of a semiconductor device structure using measurements obtained from different metrology tools in an automated manner.

BACKGROUND

Semiconductor devices, such as transistors, are the core building block of the vast majority of electronic devices. In practice, it is desirable to accurately and precisely fabricate transistors and other semiconductor devices with physical features having specific physical dimensions, to thereby achieve semiconductor devices having their intended performance characteristics and improve yield. However, the hardware tools used to fabricate the devices may exhibit performance variations. As a result, devices may be fabricated with features that deviate from their specified physical dimensions, which, in turn, could lead to failures at wafer test and/or reduce yield. Thus, it is desirable to measure physical features, critical dimensions and/or other properties of devices during fabrication to correct any deviations from the intended physical dimensions and thereby reduce the likelihood of failures at wafer test and/or improve yield. However, obtaining highly accurate measurements typically takes an undesirably long amount of time or involves destructive metrologies which reduce yield. At the same time, non-destructive measurement tools may be limited in their ability to accurately measure all of the physical features, critical dimensions, and profile information of a device, which, in turn, limits the ability of the foundry (or fab) to maximize yield.

BRIEF SUMMARY

In one embodiment, an exemplary fabrication system is provided. The fabrication system includes a processing tool to fabricate a feature of a semiconductor device structure on a wafer of semiconductor material and a hybrid measurement system. The hybrid measurement system in eludes a plurality of metrology tools cooperatively configured to determine a hybrid measurement of the feature.

In another embodiment, a method for fabricating a semiconductor device structure is provided. The method involves fabricating a feature of the semiconductor device structure on a wafer of semiconductor material, determining a hybrid recipe for measuring the feature, configuring a plurality of metrology tools to implement the hybrid recipe, and obtaining a hybrid measurement of the feature in accordance with the hybrid recipe.

In yet another embodiment, an apparatus is provided for a computer-readable medium having computer-executable instructions or data stored thereon. The computer-executable instructions or data are executable by a computing device to determine a hybrid recipe for obtaining a hybrid measurement of a feature of a semiconductor device structure fabricated on a wafer of semiconductor material by a processing tool and modify measurement recipes of a plurality of metrology tools to implement the hybrid recipe. A first metrology tool of the plurality of metrology tools executes a first measurement recipe to obtain a first measurement of the semiconductor device structure and a second metrology tool of the plurality of metrology tools executes a second measurement recipe to obtain a second measurement of the feature, wherein the hybrid measurement is determined based at least in part on the first measurement and the second measurement.

This summary is provided, to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims, when considered in conjunction with the following figures, wherein like reference numbers refer to similar elements throughout the figures.

DETAILED DESCRIPTION

Figure 1:
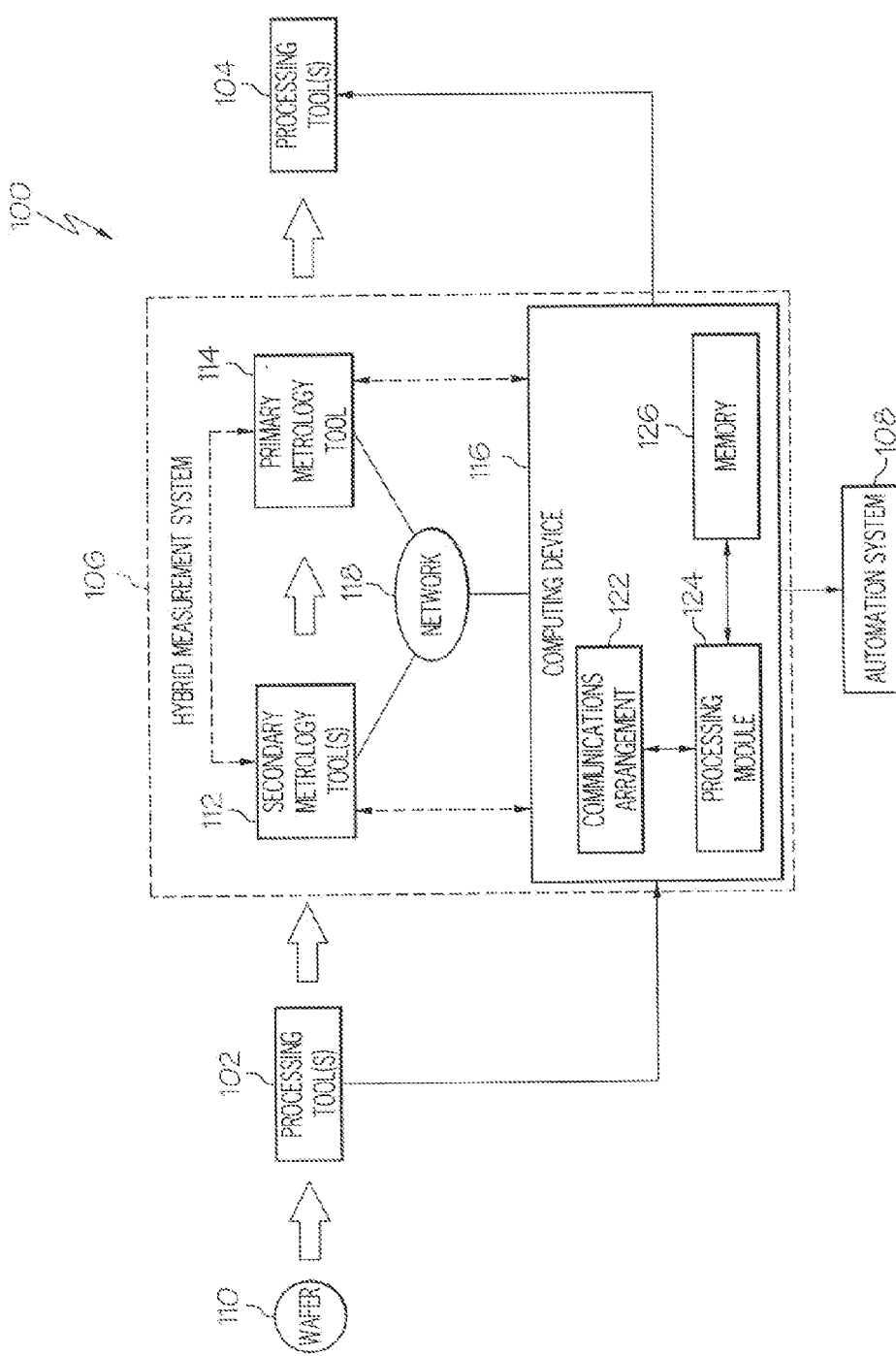
FIG. 1 is a block diagram of a fabrication system in an exemplary embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein relate to determining hybrid (or composite) measurements of features of semiconductor device structures fabricated on a semiconductor substrate using measurements obtained from different metrology tools in an automated manner. Depending on the embodiment, the feature being measured may be a physical feature, structure or dimension, an absence of a physical feature or structure (e.g., a recess, void or the like), or an intrinsic property (e.g., ion concentration, index of refraction, bulk modulus, electron mobility; or other compositional and/or optical properties). Thus, although the subject matter may be described herein in the context of measuring physical features and/or dimensions of semiconductor device structures, it should be understood that the subject matter is not limited to physical features and/or dimensions and may be utilized to obtain hybrid measurements of intrinsic properties of a semiconductor device structure. A hybrid measurement is a composite measurement of a particular feature of interest that is calculated or otherwise determined using measurements obtained from more than one metrology tool. For example, in accordance with one or more embodiments, each metrology tool determines measurements of one or more physical features and/or dimensions of a semiconductor device structure based on measurement data measured or otherwise obtained using measurement hardware associated with that metrology tool. The measurements obtained from the different metrology tools are used to augment or otherwise influence measurements from other metrology tools (e.g., by weighting them based on their relative accuracy and/or reliability or other characteristics of their respective metrology tool) to obtain a composite measurement with an accuracy and/or reliability that is greater than the accuracy and/or reliability of the individual measurements obtained by the individual metrology tools.

As described in greater detail below, an automated fabrication system includes a hybrid measurement system, which consists of a plurality of metrology tools cooperatively configured to determine a hybrid measurement of a feature of a semiconductor device structure fabricated on a wafer of semiconductor material by a preceding processing tool in accordance with a hybrid recipe. The hybrid recipe is determined substantially in real-time (e.g., after the immediately preceding processing step is completed) based on physical characteristics and/or material properties of the features fabricated on the wafer and performance characteristics of the metrology tools to determine a measurement sequence (or sampling plan) and related hybridization algorithms that are likely to provide an accurate hybrid measurement of the feature of interest. After the hybrid recipe is determined, the measurement recipes of the individual metrology tools are modified or otherwise configured to implement the hybrid recipe and the fabrication automation system is configured to automatically transfer the wafer from the preceding processing tool through the metrology tools in accordance with the measurement sequence. In this regard, each metrology tool automatically executes its respective measurement recipe upon receiving the wafer to obtain measurements of the semiconductor device structure on the wafer, and provides its measurements to a host computing device and/or another metrology tool for influencing that metrology tool's measurements. After the measurements are obtained from the plurality of metrology tools in accordance with the hybrid recipe (e.g., in the order defined by the measurement sequence), the hybrid measurement of the feature of interest is calculated or otherwise determined based on the measurements from the individual metrology tools. The final hybrid measurement of the feature of interest may be provided to the fabrication automation system and/or one or more subsequent processing tools to influence or otherwise modify subsequent processing steps for the wafer and arrive at a final semiconductor device structure on the wafer having the intended feature dimensions and performance characteristics.

Turning now to FIG. 1, in an exemplary embodiment, a fabrication system 100 includes, without limitation, a plurality of processing tools 102, 104, a fabrication automation system 108, and a hybrid measurement system 106 communicatively coupled to one or more of the processing tools 102, 104 and the fabrication automation system 108. The hybrid measurement system 106 includes, without limitation, a plurality of metrology tools 112, 114 and a host computing device 116 communicatively coupled over a communications network 118, such as a computer network (e.g., a wide area network, a wireless local area network, or the like), a cellular network, an ad-hoc or peer-to-peer network, or the like. As described in greater detail below, the metrology tools 112, 114 include hardware capable of measuring physical features, dimensions and/or other attributes of one or more semiconductor device structures formed on a substrate (or wafer) 110 of semiconductor material by one or more processing tools 102 preceding the hybrid measurement system 106, wherein measurements obtained by the different metrology tools 112, 114 are utilized to augment one another and obtain hybrid (or composite) measurements of the physical features, dimensions and/or attributes. In this regard, a hybrid measurement is calculated or otherwise determined based on different measurements from different metrology tools 112, 114 in a manner that achieves a composite measurement for a particular physical feature and/or critical dimension of the device structure(s) on the wafer 110 that is more accurate and/or reliable than an individual measurement for that feature and/or dimension that would be obtained from an individual metrology tool 112, 114. In one or more embodiments, the hybrid measurement(s) determined by the hybrid measurement system 106 are provided to or otherwise utilized by one or more subsequent processing tool(s) 104 to influence the manner in which the subsequent processing tool(s) 104 fabricate additional physical features, dimensions and/or other attributes on the wafer 110. Additionally, in some embodiments, the hybrid measurement(s) determined by the hybrid measurement system 106 may also be provided to and/or utilized by one or more preceding processing tool(s) 102 to influence fabrication of subsequent wafers.

In the illustrated embodiment of FIG. 1, the fabrication automation system 108 includes the robotics and other components of the fabrication system 100 that are configured to automatically transfer the wafer 110 to/from the processing tools 102, 104 and metrology tools 112, 114. In exemplary embodiments, the fabrication automation system 108 initially provides the wafer 110 to one or more processing tools 102, such as, for example, deposition tools, etching tools, annealing tools, and the like, to fabricate one or more physical features, dimensions and/or structures of a semiconductor device on the wafer 110. After fabrication of those features on the wafer 110, the fabrication automation system 108 provides the wafer 110 to the hybrid measurement system 106 for measuring or otherwise quantifying the fabricated dimensions of various features on the wafer 110 using a plurality of different measurement techniques, such as, for example, scatterometry, scanning electron microscopy, atomic force microscopy, interferometry, reflectometry, ellipsometry, and the like. In this regard, each metrology tool 112, 114 may use a different measurement technique than the other metrology tools 112, 114 in the hybrid measurement system 106. In exemplary embodiments, each metrology tool 112, 114 utilizes a non-destructive measurement technique (or technology) so that semiconductor devices fabricated on the wafer 110 are still suitable for their intended purpose after the wafer 110 is measured.

As described in greater detail below, in exemplary embodiments, the computing device 116 is communicatively coupled to one or more of the preceding processing tools 102 (e.g., via network 118) to obtain information pertaining to the physical features, structures and/or dimensions fabricated on the wafer 110 by the respective processing tool 102, identifies the physical characteristics and/or material properties of the feature(s) on the wafer 110 to be measured by the hybrid measurement system 106, and determines a hybrid recipe for measuring the identified feature(s) on the wafer 110. In this regard, the hybrid recipe is a collection of commands or instructions that dictate the order in which the wafer 110 is to be measured by the individual metrology tools 112, 114 and the manner in which each individual metrology tool 112, 114 measures the wafer 110 and/or utilizes measurements from another metrology tool 112, 114 to influence its measurement. To implement the hybrid recipe, the computing device 116 communicates with a respective metrology tool 112, 114 (e.g., via the network 118) to modify the measurement recipe maintained by that respective metrology tool 112, 114 to indicate which features on the wafer 110 are to be measured by that respective metrology tool 112, 114 along with additional information pertaining to how that respective metrology tool 112, 114 should perform the measurement, how that respective metrology tool 112, 114 should utilize measurements obtained by other metrology tools 112, 114, and which of the other metrology tools 112, 114 that the respective metrology tool 112, 114 should provide its measurements to. For purposes of explanation, the metrology tool 114 which measures the wafer 110 last in the measurement sequence defined by the hybrid recipe is alternatively referred to herein as the primary metrology tool, while the preceding metrology tool(s) 112 in the hybrid measurement system 106 are alternatively referred to herein as the secondary metrology tool(s) 112. To implement the hybrid recipe, the computing device 116 also signals, commands, or otherwise instructs the fabrication automation system 108 to transfer the wafer 110 from a preceding processing tool 102 to the appropriate secondary metrology tool(s) 112 in the order specified by the measurement sequence of the hybrid recipe, prior to transferring the wafer to the primary metrology tool 114 and subsequent processing tools 104.

As described in greater detail below, after a secondary metrology tool 112 finishes measuring physical feature(s) and/or other attributes of the wafer 110, the secondary metrology tool 112 provides its feature measurements to the host computing device 116 and/or another metrology tool 112, 114. In an exemplary embodiment, the primary metrology tool 114 receives or otherwise obtains measurements from one or more of the secondary metrology tools 112 for use in determining hybrid measurements for one or more physical feature(s) on the wafer 110, as described in greater detail below. In some embodiments, the final hybrid feature measurements may be determined iteratively, wherein a secondary metrology tool 112 obtains a hybrid measurement determined by the primary metrology tool 114 and potentially other feature measurements from other secondary metrology tool(s) 112 to adjust the feature measurements obtained by that secondary metrology tool 112, with the adjusted feature measurement for that secondary metrology tool 112 being utilized to determine the final hybrid feature measurement. Thus, the secondary metrology tool(s) 112 may also determine hybrid (or composite) measurements.

Still referring to FIG. 1, in an exemplary embodiment, the host computing device 116 includes, without limitation, a communications arrangement 122, a processing module 124, and memory 126. The communications arrangement 122 generally represents the hardware, software, firmware and/or combination thereof which are coupled to the processing module 124 and cooperatively configured to support communications between the host computing device 116 and the metrology tools 112, 114 via the network 118. In exemplary embodiments, the communications arrangement 122 also supports communications to/from the processing tools 102, 104 and the fabrication automation system 108. The processing module 124 generally represents the hardware, firmware; processing logic, and/or other components of the host, computing device 116 configured to support operation of the host computing device 116 and execute various functions and/or processing tasks as described in greater detail below. Depending on the embodiment, the processing module 124 may be implemented or realized with a general purpose processor, a microprocessor, a controller, a microcontroller, a state machine, a content addressable, memory, an application specific integrated circuit, a field programmable gate array, any suitable programmable logic device, discrete gate or transistor logic, discrete hardware components, or any combination thereof, designed to perform the functions described herein.

Furthermore, the steps of a method or algorithm described in connection with the embodiments disclosed herein may be embodied directly in hardware, in firmware, in a software module executed by the processing module 124, or in any practical combination thereof. The memory 126 generally represents any non-transitory short or long term storage media or other computer-readable medium capable of storing programming instructions for execution by the processing module 124, including any sort of random access memory (RAM), read only memory (ROM), flash memory, registers, hard disks, removable disks, magnetic or optical mass storage, and/or the like. The computer-executable programming instructions, when read and executed by the processing module 124, cause the processing module 124 to perform certain tasks, operations, functions, and processes described in more detail below. In exemplary embodiments, the memory 126 also stores or otherwise maintains metrology reference information for use in determining hybrid recipes to be implemented by the hybrid measurement system 106. In this regard, the metrology reference information may include data and/or information pertaining to various material properties (e.g., the physical, chemical, and/or optical properties of the materials on the wafer 110), data and/or information pertaining to the performance characteristics of the available metrology tools 112, 114 (e.g., calibration curves or other legacy information, uncertainty data, and the like), data and/or information pertaining to the physical features, dimensions, structures, and the like which are to be fabricated on the wafer 110 by the processing tools 102, 104, and the like.

It should be understood that FIG. 1 is a simplified representation of the fabrication system 100 for purposes of explanation and ease of description, and FIG. 1 is not intended to limit the subject matter in any way. In this regard, practical embodiments of the hybrid measurement system 106 may include any number of metrology tools configured to iteratively exchange measurements any number of times to achieve final hybrid measurements having a desired level of accuracy and/or reliability. Additionally, although FIG. 1 depicts the computing device 116 and metrology tools 112, 114 as being separate hardware elements, in practice, the features and/or functionality of the computing device 116 may be implemented by or otherwise integrated with a metrology tool, such as, for example, the primary metrology tool 114. Furthermore, a practical embodiment of the fabrication system 100 may include any number of processing tools 102, 104 and/or multiple instances of the hybrid measurement system 106 configured to fabricate and measure any number of physical features, dimensions and/or other attributes of structures formed on a wafer 110 and achieve a final semiconductor device structure with the desired feature dimensions and performance characteristics.

Figure 2:
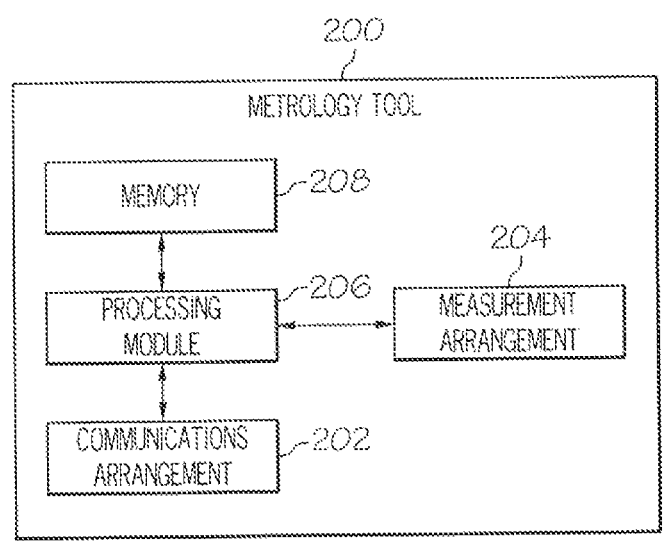
FIG. 2 is a block diagram of an exemplary metrology tool suitable for use in the fabrication system of FIG. 1 in accordance with one or more embodiments.

FIG. 2 depicts an exemplary embodiment of a metrology tool 200 suitable for use as a metrology tool 112, 114 in the hybrid measurement system 106 of FIG. 1. The illustrated metrology tool 200 includes, without limitation, a communications arrangement 202, measurement arrangement 204, a processing module 206, and memory 208. It should be understood that FIG. 2 is a simplified representation of the metrology tool 200 for purposes of explanation and ease of description, and FIG. 2 is not intended to limit the subject matter in any way.

In the illustrated embodiment, the communications arrangement 202 generally represents the hardware, software, firmware and/or combination thereof which are coupled to the processing module 206 and cooperatively configured to support communications to/from the metrology tool 200 via a network (e.g., network 118). The measurement arrangement 204 generally represents the combination of radiation sources, illumination devices, electron guns, sensors, optics, and/or other hardware components of the metrology tool 200 which are utilized to measure physical features, dimensions and/or other attributes of semiconductor devices fabricated on a wafer. In accordance with one or more embodiments, the measurement arrangement 204 is capable of transmitting, emitting, or otherwise directing a reference signal towards a wafer and sensing, receiving, or otherwise measuring a response signal from the wafer. In this regard, the physical features, dimensions and/or other attributes of the wafer modulate or otherwise influence characteristics of the reference signal resulting in the response signal that is sensed or otherwise received by the measurement arrangement 204. Thus, the response signal corresponds to raw feature measurement data that is indicative of the dimensions of the various physical features, dimensions and/or other attributes on the wafer 110, which can be determined based on characteristics of the response signal (e.g., the spectral characteristics, waveforms, or the like) or the relationship between the response signal and the reference signal.

The processing module 206 generally represents the hardware, firmware, processing logic, and/or other components of the metrology tool 200 configured to control or otherwise operate the measurement arrangement 204 to measure features of a wafer, communicate feature measurements to/from the metrology tool 200, store feature measurements in the memory 208, and execute various functions and/or processing tasks as described in greater detail below. Depending on the embodiment, the processing module 206 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, the steps of a method or algorithm described in connection with the embodiments disclosed herein may be embodied directly in hardware, in firmware, in a software module executed by the processing module 206, or in any practical combination thereof.

The memory 208 generally represents any non-transitory short or long term storage media or other computer-readable medium capable of storing programming instructions for execution by the processing module 206, which, when read and executed by the processing module 206, cause the processing module 206 to perform certain tasks, operations, functions, and processes described in greater detail below. In exemplary embodiments, the memory 208 stores or otherwise maintains a measurement recipe for the metrology tool 200 that consists of a sequence of instructions or commands which are executed by the processing module 206 and dictate the manner in which the processing module 206 operates the measurement arrangement 204 to measure the wafer and obtain raw feature measurement data along with measurement algorithms (or functions) used by the processing module 206 to calculate or otherwise determine feature measurements based on the raw feature measurement data obtained via the measurement arrangement 204. As described in greater detail below, in exemplary embodiments, the measurement recipe and measurement algorithms maintained in the memory 208 are capable of being modified to implement a hybrid recipe as part of a hybrid measurement system, such that the modified measurement recipe for the metrology tool 200 includes instructions or commands which are executed by the processing module 206 and dictate the manner in which the processing module 206 communicates feature measurements to/from other metrology tools along with modified algorithms or functions used by the processing module 206 to calculate or otherwise determine hybrid feature measurements based on the raw feature measurement data obtained via the measurement arrangement 204 and other feature measurements obtained from other metrology tools in the hybrid measurement system.

Figure 3:
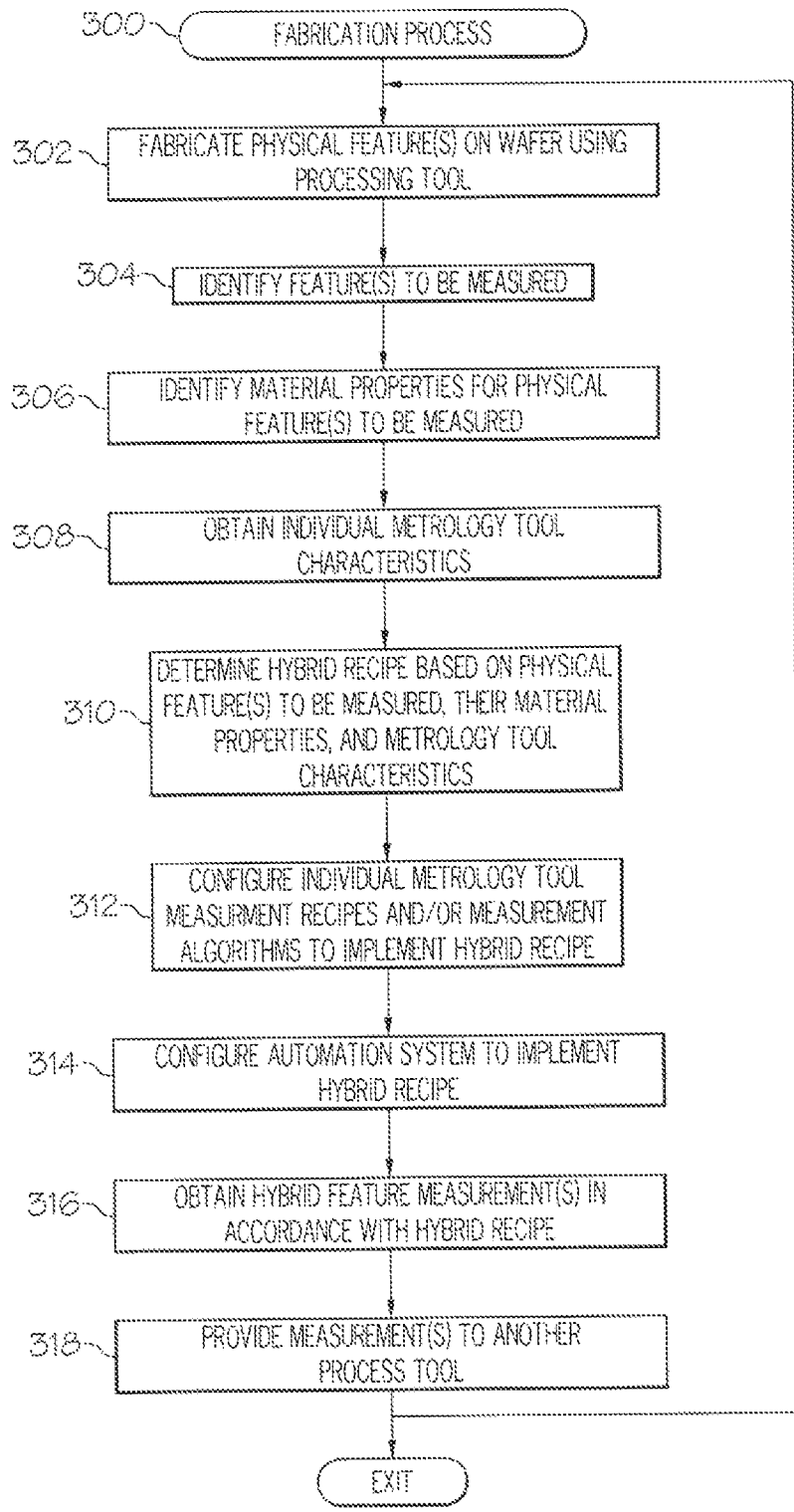
FIG. 3 is a flow diagram of an exemplary fabrication process suitable for use with the fabrication system of FIG. 1 in an exemplary embodiment.

FIG. 3 depicts an exemplary fabrication process 300 suitable for implementation by a fabrication system 100 to obtain hybrid measurements of features of semiconductor devices in an automated manner. The various tasks performed in connection with the fabrication process 300 may be performed by software, hardware, firmware, or any combination thereof. For illustrative purposes, the following description refers to elements mentioned above in connection with FIGS. 1-2. In practice, portions of the fabrication process 300 may be performed by different elements of the fabrication system 100, such as, for example, the processing tools 102, 104, the hybrid measurement system 106, the fabrication automation system 108, the primary metrology tool 114, the secondary metrology tool(s) 112, and/or the host computing device 116. It should be appreciated that the fabrication process 300 may include any number of additional or alternative tasks, the tasks need not be performed in the illustrated order and/or the tasks may be performed concurrently, and/or the fabrication process 300 may be incorporated into a more comprehensive procedure or process having additional functionality not described in detail herein. Moreover, one or more of the tasks shown and described in the context of FIG. 3 could be omitted from a practical embodiment of the fabrication process 300 as long as the intended overall functionality remains intact.

Referring to FIG. 3, and with continued reference to FIGS. 1-2, in an exemplary embodiment, the fabrication process 300 begins by fabricating one or more physical features and/or other semiconductor device structures on a wafer using one or more processing tools (task 302). In this, regard, the fabrication automation system 108 automatically transfers the wafer 110 through one or more processing tools 102 in an appropriate manner to create physical features and/or structures on the wafer 110 having dimensions chosen, to result in semiconductor devices on the wafer 110 having particular performance characteristics. After the physical features and/or structures are fabricated on the wafer using the one or more processing tools, the fabrication process 300 continues by providing the wafer to the hybrid measurement system for determining a hybrid recipe and obtaining hybrid measurements of the physical features and/or structures fabricated on the wafer in accordance with the hybrid recipe. After the processing tool 102 preceding the hybrid measurement system 106 completes a fabrication process step, the fabrication automation system 108 automatically transfers the wafer 110 from a processing tool 102 to the hybrid measurement system 106, as described in greater detail below.

Still referring to FIG. 3, in an exemplary embodiment, to determine the hybrid recipe, the fabrication process 300 identifies the physical characteristics of the feature(s) of the wafer to be measured and the material properties of the features on the wafer (tasks 304, 306). The fabrication process 300 also obtains or otherwise identifies the performance characteristics of the metrology tools of the hybrid measurement system, and determines the hybrid recipe based on the physical characteristics of the features to be measured, the material properties of those features and/or other features on the wafer, and the metrology tool performance characteristics (tasks 306, 308). In this regard, based on the physical characteristics of the features being measured and their material properties along with the individual metrology tool characteristics, the fabrication process 300 determines or otherwise identifies, as the primary metrology tool, the metrology tool of the hybrid measurement system 106 that is capable of measuring a particular feature with the highest accuracy (or lowest uncertainty) relative to the other available metrology tools. The fabrication process 300 also determines which feature measurements obtained using the other available metrology tools may be utilized to augment or otherwise improve the feature measurement of the primary metrology tool to obtain the hybrid feature measurement. In this regard, the other metrology tools function as the secondary metrology tool(s) 112 which provide measurements that are utilized by the primary metrology tool 114 to determine a hybrid measurement for a particular feature by augmenting its feature measurement using the measurements obtained from the secondary metrology tool(s) 112. The hybrid recipe determined by the fabrication process 300 includes a measurement sequence (or sampling plan) defining the order in which the metrology tool(s) 112, 114 measure the wafer 110 and which feature(s) of the wafer 110 each respective metrology tool 112, 114 should measure. The hybrid recipe also identifies which measurements obtained by one metrology tool 112, 114 are to be provided to the other metrology tools 112, 114 and the measurement algorithms and/or functions to be implemented by a metrology tool 112, 114 to augment its feature measurements using feature measurements provided by another metrology tool 112 to determine hybrid feature measurements.

After the hybrid recipe is determined, the fabrication process 300 configures the individual metrology tools of the hybrid measurement system to implement the hybrid recipe by modifying the measurement recipes and/or measurement algorithms of the individual metrology tools (task 312). For example, for each secondary metrology tool 112 utilized by the hybrid recipe, the computing device 116 modifies the respective measurement recipe maintained by the respective secondary metrology tool 112 so that the respective metrology tool 112 operates its measurement arrangement 204 to obtain the feature measurements utilized for determining a, hybrid measurement (e.g., by the primary metrology tool 114 or another secondary metrology tool 112). Additionally, the computing device 116 modifies the respective measurement recipe maintained by the respective secondary metrology tool 112 so that the respective metrology tool 112 communicates its feature measurements to the computing device 116, the primary metrology tool 114 and/or another secondary metrology tool 112. The computing device 116 also modifies the respective measurement recipe maintained by the primary metrology tool 114 so that it operates its measurement arrangement 204 to measure the identified features of interest on the wafer 110 and obtains the secondary metrology tool feature measurements obtained directly from one or more of the secondary metrology tools 112 or from the computing device 116. Additionally, the computing device 116 modifies the measurement algorithms implemented by the primary metrology tool 114 so that the primary metrology tool determines hybrid measurements for the features of interest on the wafer 110 based on the raw measurement data obtained via its measurement arrangement 204 and the secondary metrology tool feature measurements.

For example, referring to FIG. 1 and with continued reference to FIG. 3, in an exemplary embodiment, the computing device 116 and/or the hybrid measurement system 106 receives or otherwise obtains, from one or more of the preceding processing tools 102 and/or the fabrication automation system 108, information pertaining to the fabrication processes performed by the preceding processing tools 102, and based on that fabrication process information, identifies the physical characteristics of features fabricated on the wafer 110. Based on that information, the computing device 116 and/or the hybrid measurement system 106 is capable of automatically (i.e., without or otherwise independent of any manual input or other manual intervention) identifying or otherwise determining, in real-time, which physical feature(s) on the wafer 110 are to be measured. For example, the computing device 116 may identify that the preceding processing tools 102 fabricated a gate structure on the wafer 110 and that the amount of undercut of a gate dielectric material should be measured. The computing device 116 utilizes the information obtained from the preceding processing tools 102 and/or the metrology reference information maintained in memory 126 to identify the material properties for the various layers of the gate structure as well as neighboring regions of material on the wafer 110. The computing device 116 also utilizes the metrology reference information maintained in memory 126 to identify or otherwise determine performance characteristics for the individual metrology tools 112, 114 of the hybrid measurement system 106.

In one exemplary embodiment, based on the identified feature to be measured (e.g., the gate dielectric undercut), the physical characteristics and/or material properties of that feature, and the metrology tool characteristics, the computing device 116 may identify that an optical critical dimension (OCD) tool should function as the primary metrology tool 114 that determines a hybrid measurement for the gate dielectric undercut and that an atomic force microscopy (AFM) tool and a critical dimension scanning electron microscopy (CDSEM) tool should function as secondary metrology tools 112 that measure other features of the wafer 110. For example, the computing device 116 may determine that the AFM tool should obtain measurements of the gate sidewall angle, that the CDSEM tool should obtain measurements of the gate critical dimension (e.g., the gate width), that the gate sidewall angle measurements from the AFM tool should be provided to the CDSEM tool for augmenting the gate critical dimension measurement, and that the gate sidewall angle measurements and the gate critical dimension measurements should be provided to the OCD tool for determining the hybrid gate dielectric undercut measurement. In this regard, the hybrid recipe determined by the computing device 116 includes a sampling plan indicating a measurement sequence that begins with the wafer 110 being measured by the AFM tool first, then the CDSEM tool, followed by the OCD tool.

Continuing the above, example, to implement, the hybrid recipe, the computing device 116 modifies the recipe of the AFM tool so that the AFM tool measures the sidewall angle of the gate structure fabricated on the wafer 110 and provides the gate sidewall angle measurement to the CDSEM tool, the OCD tool, and/or the computing device 116. Similarly, the computing device 116 modifies the recipe of the CDSEM tool so that the CDSEM tool measures the critical dimension of the gate structure fabricated on the wafer 110 and modifies the algorithms utilized by the CDSEM tool to determine a hybrid gate critical dimension based on the raw feature measurement data obtained via its measurement arrangement 204 and the gate sidewall angle measurement from the AFM tool provided to the CDSEM tool by the AFM tool and/or the computing device 116. In this regard, the algorithm used by the CDSEM tool when calculating the gate critical dimension may be modified using the gate sidewall angle measurement from the AFM tool. For example, one or more algorithm parameters or settings (e.g., a grayscale threshold or the like) may be modified (e.g., increased and/or decreased) based on the gate sidewall angle measurement from the AFM tool. The computing device 116 also modifies the recipe of the CDSEM tool so that the CDSEM tool provides the hybrid gate critical dimension measurement to the OCD tool and/or the computing device 116.

In an exemplary embodiment, the computing device 116 also modifies the recipe of the OCD tool so that the OCD tool measures the gate dielectric undercut of the gate structure fabricated on the wafer 110. In accordance with one or more embodiments, the computing device 116 modifies the algorithms utilized by the OCD tool to determine a hybrid gate dielectric undercut based on the raw feature measurement data obtained via its measurement arrangement 204, the gate, sidewall angle measurement from the AFM tool provided by the AFM tool and/or the computing device 116, and the hybrid gate critical dimension measurement from the CDSEM tool provided by the CDSEM tool and/or the computing device 116. For example, the OCD tool may determine the hybrid gate dielectric undercut measurement as a function of the gate dielectric undercut measured by its measurement arrangement 204 (e.g., the raw gate dielectric undercut measurement), the hybrid gate critical dimension measurement, and the gate sidewall angle measurement, wherein the raw gate dielectric undercut measurement, the hybrid gate critical dimension measurement, and the gate sidewall angle measurement are weighted in accordance with their relative accuracy and/or reliability (e.g., using a quality weighting factor based on or influenced by the total measurement uncertainty (TMU) and/or reference measurement system uncertainty (RMSU) of the respective metrology tool 112, 114). In this regard, the gate sidewall angle measurement from the AFM tool and/or the hybrid gate critical dimension measurement from the CSDEM tool may be utilized to reduce the number of floating parameters in the algorithm used by the OCD tool when calculating the gate dielectric undercut. The computing device 116 also modifies the recipe of the OCD tool to provide the hybrid gate dielectric undercut measurement to the computing device 116 for subsequent provision to one or more subsequent processing tools 104. In other embodiments, the computing device 116 may modify the recipe of the OCD tool to provide the raw gate dielectric undercut measurement to the computing device 116, wherein the computing device 116 determines the hybrid gate dielectric undercut measurement based on the raw gate dielectric undercut measurement received from the OCD tool, the hybrid gate critical dimension measurement received from the CDSEM tool, and the gate sidewall angle measurement received from the AFM tool.

Referring again to FIG. 3 and with continued reference to FIG. 1, after configuring the metrology tools to implement the hybrid recipe, the fabrication process 300 continues by configuring the fabrication automation system to automatically transfer the wafer through the individual metrology tools in accordance with the measurement sequence (Or sampling plan) defined by the hybrid recipe (task 314). In this regard, the computing device 116 and/or the hybrid measurement system 106 also provides commands or instructions to the fabrication automation system 108 that configure the fabrication automation system 108 to automatically transfer the wafer 110 from the preceding processing tool 102 through the metrology tools 112, 114 in the order defined by sampling plan for the hybrid recipe. For example, the computing device 116 may signal, command, or otherwise instruct the fabrication automation system 108 to sequentially transfer the wafer 110 from the preceding processing tool 102 to a first secondary metrology tool 112 (e.g., the AFM tool), from the first secondary metrology tool 112 to a second secondary metrology tool 112 after first secondary metrology tool 112 finishes executing its measurement recipe (e.g., from the AFM tool to the CDSEM tool after the AFM tool obtains the gate sidewall angle measurement), and then from the second secondary metrology tool 112 to the primary metrology tool 114 after second secondary metrology tool 112 finishes executing its measurement recipe (e.g., from the CDSEM tool to the OCD tool after the CDSEM tool obtains the gate critical dimension measurement).

After the fabrication process 300 configures the metrology tools and the fabrication automation system, to implement the hybrid recipe, the fabrication process 300 continues by obtaining hybrid feature measurement(s) in accordance with the hybrid recipe and providing the hybrid feature measurement(s) to one or more succeeding processing tools (tasks 316, 318). In this regard, after the wafer 110 is processed by the processing tool 102 preceding the hybrid measurement system 106, the fabrication automation system 108 automatically transfers the wafer 110 from the preceding processing tool 102 to the first secondary metrology tool 112 (e.g., the AFM tool) of the sampling plan measurement sequence. The first secondary metrology tool 112 (e.g., the AFM tool) implements a portion of the hybrid recipe by executing its modified measurement recipe to obtain a measurement of a feature or attribute of the wafer 110 (e.g., the gate, sidewall angle measurement) and provide that feature measurement to another metrology tool 112, 114 and/or the computing device 116. After first secondary metrology tool 112 finishes executing its measurement recipe, the fabrication automation system 108 transfers the wafer 110 from the first secondary metrology tool 112 to the second secondary metrology tool 112 (e.g., the CDSEM tool), which implements another portion of the hybrid recipe by executing its modified measurement recipe to obtain a measurement of another feature or, attribute of the wafer 110 (e.g., the gate critical dimension measurement) and provide that feature measurement to the primary metrology tool 114 and/or the computing device 116. After second secondary metrology tool 112 finishes executing its measurement recipe, the fabrication automation system 108 transfers the wafer 110 from the second secondary metrology tool 112 to the primary metrology tool 114 (e.g., the OCD tool), which implements another portion of the hybrid recipe by executing its modified measurement recipe to obtain a measurement of another feature or attribute of the wafer 110 (e.g., the gate dielectric undercut measurement). As described above, the primary metrology tool 114 and/or the computing device 116 utilizes the feature measurements obtained from the secondary metrology tools 112 to augment the feature measurement obtained by the primary metrology tool 114 to determine a hybrid feature measurement.

In accordance with one or more embodiments, the computing device 116 provides the hybrid feature measurement to one or more of the processing tools 102, 104 and/or the fabrication automation system 108 for modifying subsequent process steps based on the hybrid feature measurement. In this regard, if the fabrication system 100 and/or the fabrication automation system 108 supports advanced process control (APC) or another automated process management feature, the hybrid feature measurement may be utilized to modify the recipes of preceding processing tools 102 for future wafers and/or subsequent processing tools 104 for the current wafer 110. For example, the fabrication recipe executed by a subsequent processing tool 104 may be adjusted to correct any deviations between the hybrid feature measurement and an intended feature measurement that exceed a threshold amount, or the fabrication automation system 108 may transfer the wafer 110 in a manner that bypasses one or more subsequent processing tools 104 when the hybrid feature measurement is substantially equal to the intended feature measurement (e.g., within a threshold amount of the intended feature measurement). In other embodiments, the fabrication recipe executed by one or more preceding processing tools 102 may be adjusted to correct any deviations between the hybrid feature measurement and an intended feature measurement, thereby increasing the likelihood that subsequent wafers achieve the intended feature measurements without the need for any corrective action.

Still referring to FIG. 3, in practice, the fabrication process 300 repeats throughout operation of the fabrication system 100 to fabricate semiconductor device structures on additional wafers. In this regard, for each iteration of the fabrication process 300, the hybrid recipe determined by the hybrid measurement system 106 and/or the computing device 116 may vary depending on hybrid feature measurements determined for previous wafers. For example, the hybrid measurement system 106 and/or the computing device 116 may analyze or otherwise determine uncertainty and/or accuracy metrics for hybrid feature measurements determined by the hybrid measurement system 106 and adjust the hybrid recipe for subsequent manners in a manner that is intended to improve the accuracy and/or reduce the uncertainty of the hybrid feature measurements. In this manner, the hybrid recipes implemented by the hybrid measurement system 106 may vary dynamically over time.

To briefly summarize, one advantage of the fabrication process 300 described herein is that accurate and/or reliable hybrid measurements for physical features and/or dimensions on a wafer are determined using measurements from different metrology tools in an automated manner. A hybrid recipe is determined substantially in real-time and the metrology tools and fabrication automation system may be automatically configured to implement the hybrid recipe, thereby allowing the hybrid measurement system to be seamlessly integrated between processing steps and dynamically vary the hybrid measurements determined by the hybrid measurement system based on the features fabricated on the wafer. As a result, highly accurate measurements can be obtained in a reduced amount of time and in a non-destructive manner by combining independent measurements from different metrology tools, as described above, thereby allowing a foundry or other fabrication entity to achieve a higher yield. For example, a foundry may fabricate a particular physical feature and/or dimension of interest for a semiconductor device or integrated circuit on a wafer of semiconductor material using conventional semiconductor fabrication techniques and utilize multiple metrology tools to measure that physical feature and/or dimensions and determine a hybrid measurement of that physical feature and/or dimension which is accurate and/or reliable in an automated manner and without utilizing a destructive metrology technique (e.g., TEM or the like), thereby allowing the semiconductor device structure to function in the desired manner after being measured.

For the sake of brevity, conventional techniques related to semiconductor metrology tools and/or methods, semiconductor fabrication, fabrication automation, correlation and/or uncertainty analysis, and other functional aspects of the systems (and the individual operating components of the systems) are not described in detail herein. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A fabrication system comprising:
   a processing tool to fabricate a feature of a semiconductor device structure on a wafer of semiconductor material;
   a hybrid measurement system including a plurality of metrology tools cooperatively configured to determine a hybrid measurement of the feature, wherein the plurality of metrology tools comprises a primary metrology tool and one or more secondary metrology tools and wherein the primary metrology tool receives or otherwise obtains measurements of the feature from one or more of the secondary metrology tools for use in determining the hybrid measurement of the feature; and
   a computing device communicatively coupled to the plurality of metrology tools, wherein the computing device is configured to modify a respective measurement recipe for a respective metrology tool of the plurality of metrology tools to determine the hybrid measurement.

2. The fabrication system of claim 1, wherein the computing device is configured to:
   determine a hybrid recipe for the hybrid measurement based on performance characteristics of the plurality of metrology tools; and
   modify the respective measurement recipes for the respective metrology tools of the plurality of metrology tools to implement the hybrid recipe.

3. The fabrication system of claim 2, wherein the computing device is configured to:
   identify physical characteristics of the feature fabricated by the processing tool; and
   determine the hybrid recipe for the hybrid measurement of the feature based on the physical characteristics of the feature and the performance characteristics of the plurality of metrology tools.

4. The fabrication system of claim 2, further comprising an automation system coupled to the computing device, the hybrid recipe including a measurement sequence for the plurality of metrology tools, wherein the computing device is configured to instruct the automation system to transfer the wafer among the plurality of metrology tools in accordance with the measurement sequence.

5. The fabrication system of claim 1, further comprising a second processing tool to obtain the hybrid measurement from the hybrid measurement system, wherein the second processing tool is configured to fabricate a second feature of the semiconductor device structure on the wafer in a manner that is influenced by the hybrid measurement.

6. The fabrication system of claim 1, wherein the computing device is configured to:
   modify a first measurement recipe of a first metrology tool of the plurality of metrology tools to obtain a first measurement of the feature; and
   modify a second measurement recipe of a second metrology tool of the plurality of metrology tools to obtain a second measurement of the semiconductor device structure, wherein the hybrid measurement is determined based at least in part on the first measurement and the second measurement.

7. The fabrication system of claim 6, further comprising an automation system coupled to the computing device, wherein the computing device is configured to:

determine a measurement sequence for the first metrology tool and the second metrology tool based on performance characteristics of the first metrology tool, performance characteristics of the second metrology tool, and physical characteristics of the feature; and instruct the automation system to transfer the wafer from the processing tool to the first metrology tool or the second metrology tool in accordance with the measurement sequence.

8. The fabrication system of claim 7, wherein:

the automation system is configured to:

transfer the wafer from the processing tool to the second metrology tool; and transfer the wafer from the second metrology tool to the first metrology tool after the second measurement is obtained; and the first metrology tool is communicatively coupled to the second metrology tool and configured to:

obtain the second measurement; and determine the hybrid measurement based at least in part on the first measurement and the second measurement.

9. The fabrication system of claim 1, further comprising an automation system, wherein the computing device is additionally communicatively coupled to the automation system, wherein the computing device is configured to:

determine a hybrid recipe for the hybrid measurement;

configure the plurality of metrology tools to implement the hybrid recipe; and configure the automation system to transfer the wafer from the processing tool to the plurality of metrology tools in accordance with the hybrid recipe.

10. A method of fabricating a semiconductor device structure, the method comprising:

fabricating a feature of the semiconductor device structure on a wafer of semiconductor material;

determining a hybrid recipe for measuring the feature;

configuring a plurality of metrology tools to implement the hybrid recipe, wherein the plurality of metrology tools comprises a primary metrology tool and one or more secondary metrology tools; and obtaining a hybrid measurement of the feature in accordance with the hybrid recipe, wherein the primary metrology tool receives or otherwise obtains measurements of the feature from one or more of the secondary metrology tools for use in obtaining the hybrid measurement of the feature.

11. The method of claim 10, wherein configuring the plurality of metrology tools comprises:

modifying a first measurement recipe of a first metrology tool of the plurality of metrology tools to obtain a first measurement of the semiconductor device structure; and modifying a second measurement recipe of a second metrology tool of the plurality of metrology tools to obtain a second measurement of the feature, wherein the hybrid measurement is determined based at least in part on the first measurement obtained by the first metrology tool and the second measurement obtained by the second metrology tool.

12. The method of claim 11, wherein configuring the plurality of metrology tools further comprises:

modifying the second measurement recipe of the second metrology tool to obtain the first measurement; and modifying an algorithm implemented by the second metrology tool to determine the hybrid measurement based at least in part on the first measurement and the second measurement.

13. The method of claim 11, wherein obtaining the hybrid measurement comprises:

transferring the wafer to the first metrology tool;

executing, by the first metrology tool, the first measurement recipe to obtain the first measurement;

transferring the wafer to the second metrology tool after the first metrology tool executes the first measurement recipe;

executing, by the second metrology tool, the second measurement recipe to obtain the second measurement; and determining the hybrid measurement based at least in part on the first measurement and the second measurement.

14. The method of claim 10, further comprising identifying physical characteristics of the feature, wherein determining the hybrid recipe comprises determining the hybrid recipe based on the physical characteristics of the feature and performance characteristics of the plurality of metrology tools.

15. The method of claim 10, the hybrid recipe including a sampling plan indicating an order for measuring the wafer using the plurality of metrology tools, wherein obtaining the hybrid measurement comprises configuring an automation system to transfer the wafer among the plurality of metrology tools in the order indicated by the sampling plan.

16. The method of claim 10, further comprising fabricating a second feature of the semiconductor device structure on the wafer in a manner that is influenced by the hybrid measurement.

17. A computer-readable medium having computer-executable instructions stored thereon executable by a computing device to:

determine a hybrid recipe for obtaining a hybrid measurement of a feature of a semiconductor device structure fabricated on a wafer of semiconductor material by a processing tool; and modify measurement recipes of a plurality of metrology tools to implement the hybrid recipe, wherein a first metrology tool of the plurality of metrology tools executes a first measurement recipe to obtain a first measurement of the semiconductor device structure and a second metrology tool of the plurality of metrology tools executes a second measurement recipe to obtain a second measurement of the feature, the hybrid measurement being determined based at least in part on the first measurement and the second measurement, wherein the second metrology tool receives or otherwise obtains measurements of the feature from the first metrology tool for use in determining the hybrid measurement of the feature.

18. The computer-readable medium of claim 17, wherein the computer-executable instructions stored thereon are executable by the computing device to provide the hybrid measurement to a subsequent processing tool.

19. The computer-readable medium of claim 17, wherein the computer-executable instructions stored thereon are executable by the computing device to configure an automation system to transfer the wafer from the processing tool to the plurality of metrology tools in accordance with the hybrid recipe, wherein the automation system automatically transfers the wafer from the processing tool to the first metrology tool and from the first metrology tool to the second metrology tool after the first measurement is obtained.

* * * * *